(12) United States Patent
Kern et al.

(10) Patent No.: US 6,238,025 B1
(45) Date of Patent: May 29, 2001

(54) ASSEMBLY CARRIER

(75) Inventors: Klaus Kern, Straubenhardt; Michael Joist, Gaggenau; Volker Haag, Bad Wildbad, all of (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 09/417,971

(22) Filed: Oct. 13, 1999

(30) Foreign Application Priority Data

Oct. 14, 1998 (EP) .................................. 98 119 344

(51) Int. Cl.[7] ............................................. H05K 5/00
(52) U.S. Cl. ................................. 312/223.2; 312/257.1
(58) Field of Search .................................. 361/752, 756, 361/759, 802, 796; 312/223.1, 223.2, 257.1, 263, 265.5; 211/26, 26.2

(56) References Cited

U.S. PATENT DOCUMENTS

| 3,098,177 | * | 7/1963 | Bleier . | |
| 3,347,608 | * | 10/1967 | Ritchie | 312/263 X |
| 4,429,937 | * | 2/1984 | Stockmaster . | |
| 5,154,300 | * | 10/1992 | Joist . | |
| 5,504,656 | * | 4/1996 | Joist | 361/759 X |
| 5,735,411 | * | 4/1998 | Flamme et al. | 312/223.1 X |

FOREIGN PATENT DOCUMENTS

| 94 02 714 | 4/1994 | (DE) . |
| 196 44 420 | 8/1997 | (DE) . |
| 298 06 897 U | 8/1998 | (DE) . |

* cited by examiner

Primary Examiner—Janet M. Wilkens
(74) Attorney, Agent, or Firm—Merchant & Gould P.C.

(57) ABSTRACT

An assembly carrier for plug-in circuit boards has front supporting rails formed from the front end of a cover plate and base plate and has two side walls. Each of the supporting rails includes a roof that assists in insertion and removal of the plug-in circuit board. The roof includes a row holes and is formed from front edges of the cover plate and the base plate. A sectional rail of extruded aluminum is fastened on the cover plate and the base plate.

8 Claims, 3 Drawing Sheets

ASSEMBLY CARRIER

BACKGROUND OF THE INVENTION

The invention refers to an assembly carrier for plug-in circuit boards with two front supporting rails and two side panels, as well as a cover plate and a base plate, whereby each supporting rail possesses a roof for removing and inserting assistance of the plug-in circuit boards and a row of holes are indicated on the roof.

The invention finds application with assembly carriers, which are needed with identical structure and in large numbers.

For a long time, assembly carriers have been known to have a modular structure for the installation of plug-in circuit boards equipped with electronic elements. Between two side panels, supporting rails are attached in the front and back as well as above and below, whereby a simple framework is formed. The supporting rails also known as assembly rails, serve for the attachment of guide rails for the plug-in circuit boards, for the attachment of the standardized front plates of the plug-in circuit boards, for back wiring boards, and for connector plugs. The openings between the supporting rails are closed if necessary by cover plates and base plates as well as with back walls, whereby with HF shielded assembly carriers the unwanted assembly slots with resilient contact strips are armored. Such a structure made from different materials, from extruded aluminum sectional rails and punched aluminum plates is flexible, yet in addition, cost-intensive. Also, the number of the individual parts used with their many junction points becomes unfavorably apparent in HF shielded applications.

In the utility model DE 298 06 897 U1, the application reveals an assembly carrier, where the floor plate and cover plate are made of corrosion proof steel sheet. At their front edges angled tabs of steel sheet are arranged, the front edges as well as the angled tabs form the front supporting rails. This base, cover, and assembly rail integrated building method is low-priced to produce, however sometimes it leaves something to be desired regarding the form of the manufactured supporting rails.

It is the task of the invention to form an assembly carrier with integrated supporting rails in such a way, that all of these requirements are addressed in the profile of the supporting rail and that it is rational to manufacture.

SUMMARY OF THE INVENTION

For the solution of the proposed task, an assembly carrier of the initially mentioned design is used, and then it is proceeded by solving the task through the fact that, for the creation of the two front supporting rails, the roof is formed by the front edges of the cover plate and base plate and there is fastened on this in each case a sectional rail from extruded aluminum.

The suggested assembly carrier can be rationally produced and the construction of its supporting rails can be achieved through a tight connection of its cover and base made of steel sheet with a sectional rail of aluminum. The result is an assembly carrier that can correspond to all standards and conditions.

In its simplest version, the cover and base are integrated with the sectional rail and are formed and fastened in each case to the front area of the plates, the supporting rail is aligned with the cover plate or the base plate.

It is advantageous however, if behind the sectional rail, the cover plate and base plate are bent twice in the opposite direction at right-angles and forms a stem between the two bent sections. This bent section allows the formation of a supporting rail in form of a standard assembly rail.

In the simplest case the sectional rail is attached at the cover plate or base plate at least through an electrically conductive adhesive fastener.

The sectional rail can also be fastened at the cover plate or base plate by means of screws.

In accordance with a further type of mounting, a set of projecting prongs which bear rivet heads are formed at an outer wall of the sectional rail and are pushed through a corresponding row of holes at the roof.

For the improvement of the transmission of forces between the roof and sectional rail, for positioning and to avoid lateral turn out of the sectional rail, the roof bears on its top side a set of projecting cogs, which intervene in a holding groove at the outer wall of the sectional rail.

In a preferred embodiment of the invention, regarding the attachment of the sectional tabs to the roofs of such cover and base plates, which are bent twice at right-angles, the sectional rail indicates a narrow longitudinal groove and both the cover plate and the base plate carry, at their upper forming edge, a number of tangs punched out of the stem. The sectional rails rest under pressure against the tangs facing the areas of the outside longitudinal groove wall. Hereby the area is transformed with a caulking of the longitudinal groove's wall. The gap between the longitudinal groove wall and the stem will be closed by material displacement on the stem. The longitudinal groove wall can be shifted under the tangs by a skillful bending of the material. This type of mounting produces, at the same time, in connection with the cogs on the roof and the holding groove of the sectional rail, an unusually rigid and electrically conductive connection and ensures a level resting of the sectional rails upon on the roof.

It is an advantage worth noting that the invention includes, that the one unshaped cross section indicated sectional rail is designed as a standard assembly rail and for this reason is equipped with contact surfaces as well as a deep channel, on whose opposing walls lie holding grooves for the accommodation of retaining means and positioning elements for the plug-in circuit boards.

The production and assembly of the conceptualized assembly carrier are simplified substantially, if the cover plate and base plate indicate attachment borders, bent up along their long sides, to which the side panels are appropriately attached.

For the formation of the back, upper, and lower supporting rails of the assembly carrier, bent sections can be formed in a cost-saving way at the back edge of both the cover plate and base plate.

BRIEF DESCRIPTION OF THE DRAWINGS

The invention is more nearly described below in a design example with reference to the attached drawings. Shown are.

DETAILED DESCRIPTION

Figure 1:
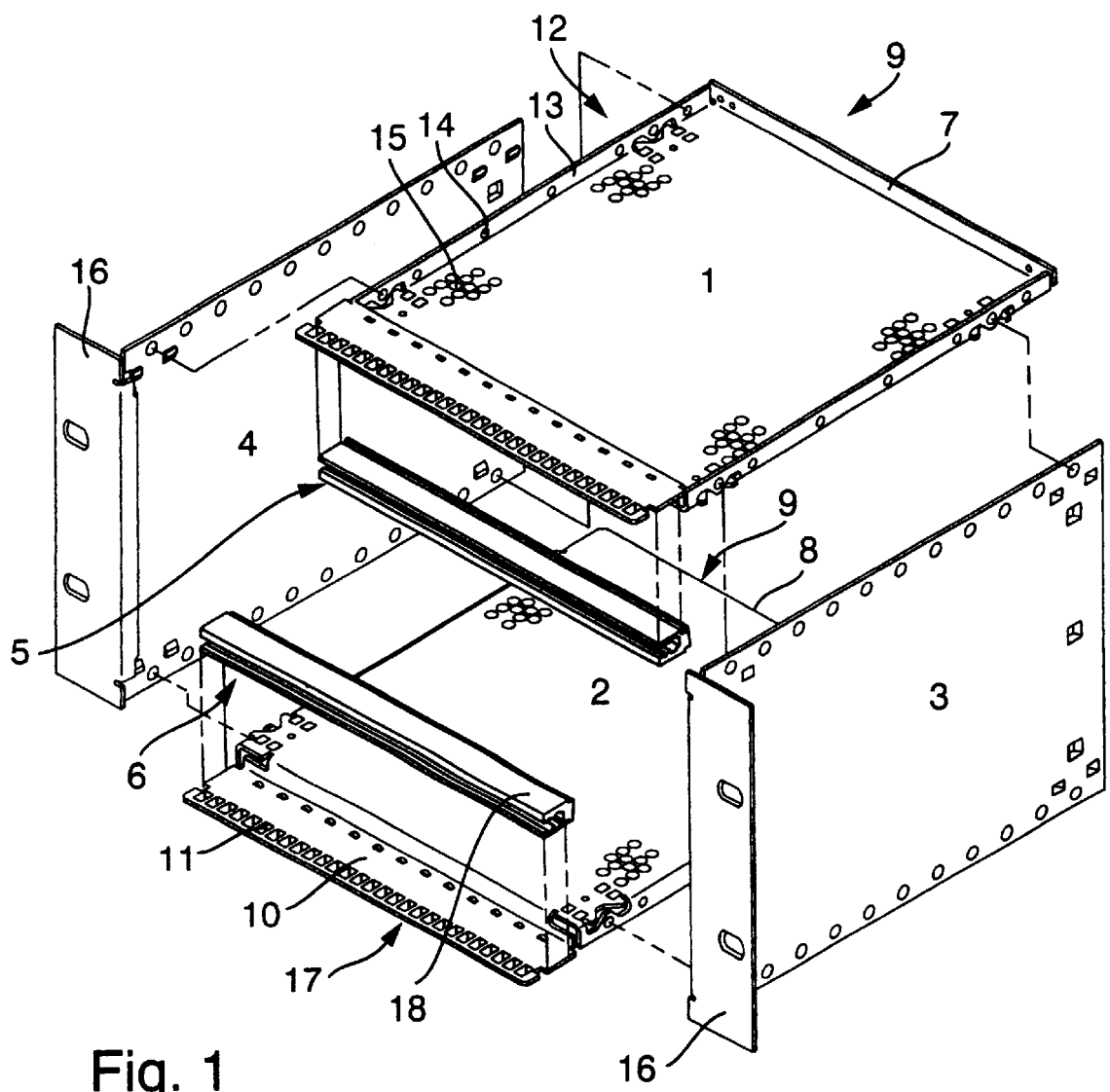
FIG. 1 An assembly carrier in a perspective enlarged representation.
Figure 2:
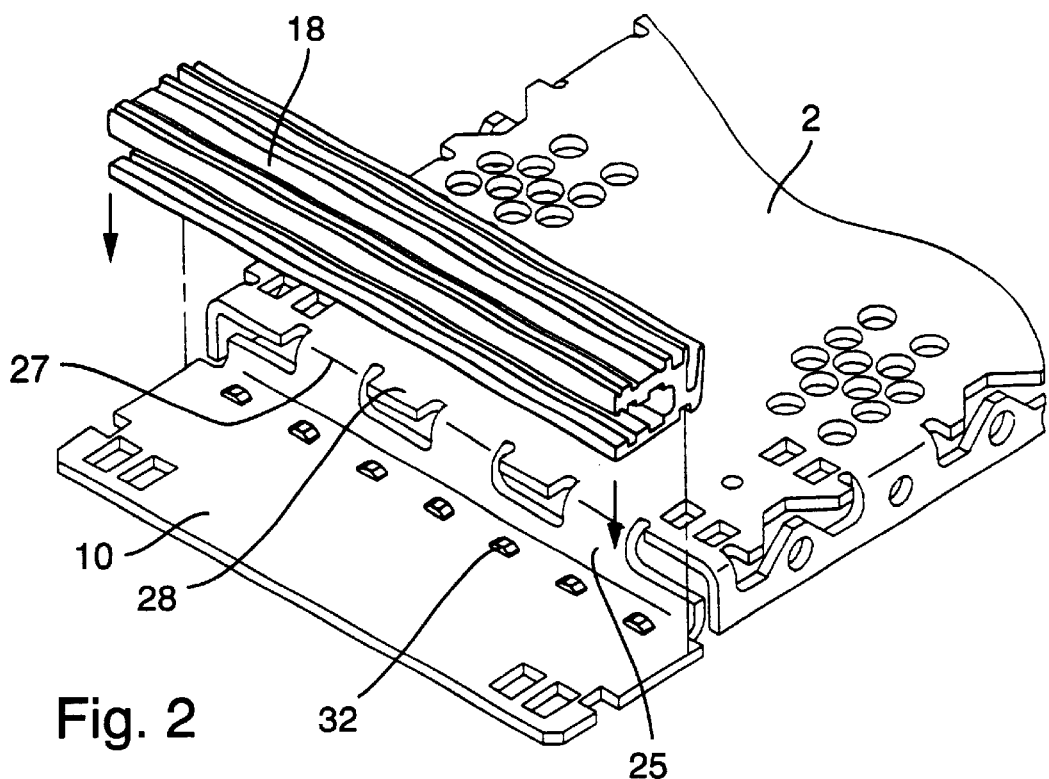
FIG. 2 A cut-out of the front section of a base plate from the assembly carrier in FIG. 1 together with a sectional rail before their attachment at the base plate, in perspective and increased scale.
Figure 3:
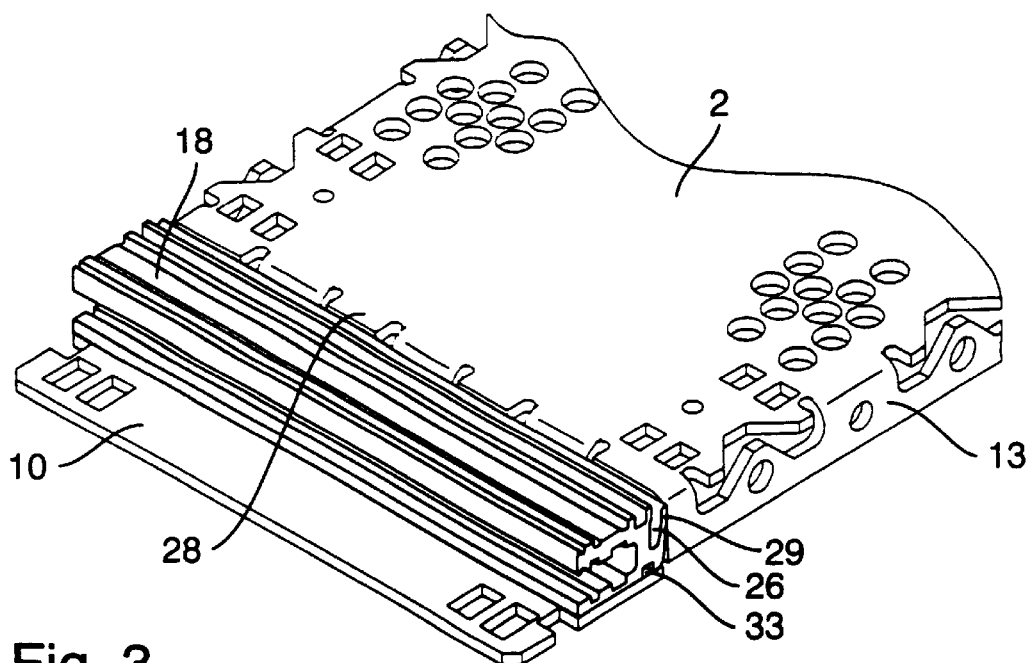
FIG. 3 The cut-out from FIG. 2 with a fastened sectional rail on the base plate.

The assembly carrier shown in FIG. 1 consists of a cover plate 1, a base plate 2, a right side panel 3, a left side panel 4, an upper, front supporting rail 5 and a lower, front supporting rail 6. Two back supporting rails 7 and 8 are formed by the bent edges 9 of the cover plate 1 and the base plate 2.

The cover plate 1 and the base plate 2 are stampings from a surface protected steel sheet, while the two side panels 3 and 4 are made of stampings from anodized aluminum plates.

Each of the two supporting rails 5 and 6 possess a roof 10 in shape of a board, front ledge, which indicates a row of holes 11, which for the intervention serve as assistance for removal and assembly of the plug-in circuit boards (not represented). The cover plate 1 and base plate 2 indicate upward curved attachment borders 13 on its long sides 12, which carry screw holes 14 and to which the side panels 3 and 4 are fastened.

Cover plate 1 and base plate 2 are provided with groups of ventilation holes 15.

On the back side of the cover plate 1 and base plate 2 a bent section of the back edge 9 is intended in each case for the formation of assembly carrier's back supporting rail 7 and 8. Alternatively, it is conceivable to arrange the back supporting rails 7, 8, similar to the front supporting rails 5, 6.

Right-angled outward standing fastening flanges 16 are attached on the two side panels 3 and 4. With these the assembly carrier can be fastened in an equipment cabinet, housing, or framework rack.

The roof 10 of the two supporting rails 5 and 6 is in each case formed at the front edges 17 of the cover plate and the base plate 2.

Behind the row of holes 11 on the roof 10, a sectional rail 18 from extruded aluminum is fastened both on the cover plate 1 and on the base plate 2.

Figure 4:
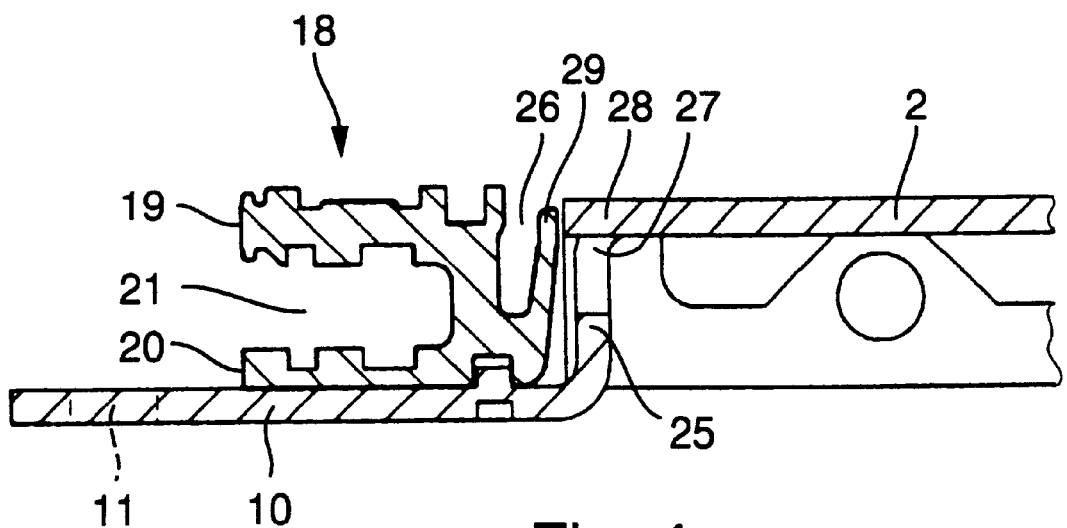
FIG. 4 The front section of the base plate from the assembly carrier in FIG. 1 also a sectional rail, in strongly increased scale.
Figure 5:
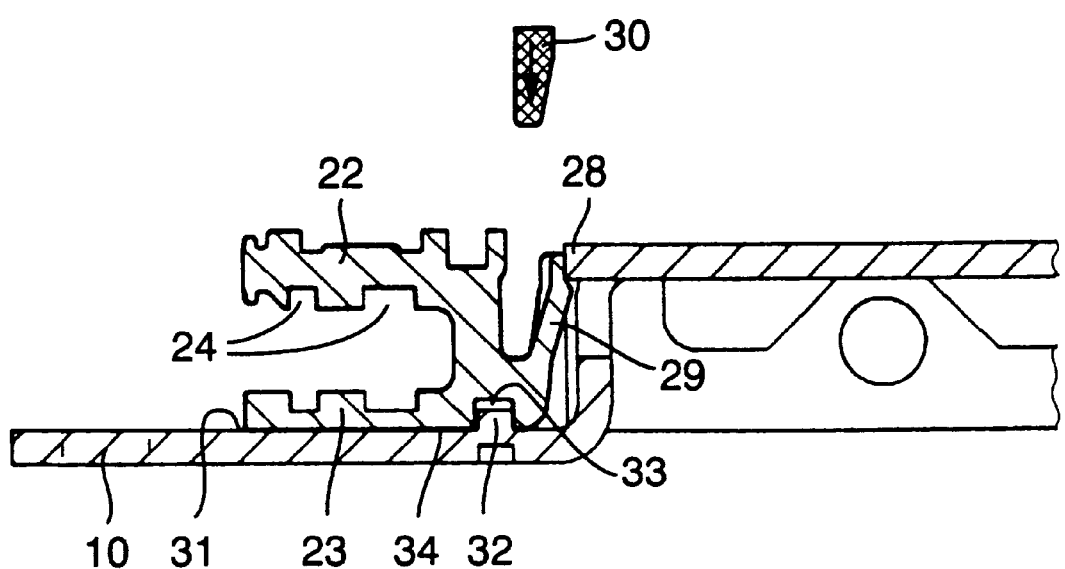
FIG. 5 The front section of the base plate in FIG. 4 with the longitudinal groove, formed by a die in the malleable longitudinal wall under the projecting tangs, of the sectional rail.

The sectional rail 18 possesses (compare FIGS. 4 and 5) an essentially u-shaped cross section and is designed as a standard assembly rail. It is equipped with contact surfaces 19 and 20, which are provided for the front plates of the plug-in circuit boards. It also bears a deep channel 21, on whose opposite walls 22 and 23, holding grooves 24 are intended for the accommodation of (not represented) retaining devices and positioning elements for the plug-in circuit boards, for example tapped hole stripes, adjusting bands, and rows of holes.

Behind the sectional rail 18 the cover plate 1 and base plate 2 are bent twice in the opposite direction at right-angles, whereby between the two bent sections a narrow stem 25 is produced. Compare in particular FIG. 4.

The sectional rail 18 can be connected at the cover plate 1 or base plate 2 through an adhesive substance, screwing, or by prongs, which come together in a row of holes and are riveted. With the design example (see FIGS. 4 and 5) the attachment takes place in such a way that the sectional rail 18 indicates a narrow and deep longitudinal groove 26 and that the cover plate 1 or the base plate 2 possess a number of tangs 28, which are punched-out from the stem 25, on their upper forming edge 27. These tangs 28 are aligned with the cover plate 1 or the base plate 2.

The sectional rail 18 rests in an area opposite the tangs 28 with the outside of the longitudinal groove 26 and resilient longitudinal wall 29 under a pressed fit against the tangs 28. The resilience of the longitudinal wall 29 and the thereby obtained pressed fit can be achieved by a caulking, as a conical die 30 is pressed into the longitudinal groove 26. See FIG. 5. Through a skillful resilience a portion of the longitudinal wall is pressed under the tangs 28. In order to work against the sectional rail 18, the roof 10 carries a set of projecting cogs 32, which mate with a low holding groove 33 at the outer wall 34 of the sectional rail 18 on its top side 31. The sectional rails 18, which are firmly connected with the cover plate and the base plate form front supporting rails 5 or 6, which with the appropriate dimensions layout, results in a standard assembly rail.

What is claimed is:

1. An assembly carrier for plug-in circuit boards, comprising:

two front supporting rails, two side walls, a cover plate and a base plate, wherein each supporting rail possesses a roof for assistance in removal and insertion of the plug-in circuit boards, each roof indicates a row of holes, characterized by the following features:

for the creation of the two front supporting rails (1 and 2), each roof (10) is formed from respective front edges (17) of the cover plate (1) and the base plate (2), wherein behind the edge (17) of each roof (10) a sectional rail (18) of extruded aluminum is fastened on both the cover plate (1) and the base plate (2).

2. Assembly carrier according to claim 1, wherein the cover plate (1) and base plate (2) behind the sectional rails (18) are bent twice in the opposite direction at right-angles and form a stem (25) between the two bent sections.

3. Assembly carrier according to claim 1, wherein each roof (10) on one of its sides (31) carries a series of projecting cogs (32), which mate with a holding groove (33) at an outer wall (34) of the sectional rail (18).

4. Assembly carrier according to claim 2, wherein each sectional rail (18) has a narrow longitudinal groove (26), and the cover plate (1) as well as the base plate (2) carry, on a forming edge (27), a number of tangs (28), punched-out of the stem (25), wherein the tangs (28) rest in the area across from the sectional rail (18), against the outside of a wall of the longitudinal groove (26), and lie under a force fit and are partially held.

5. Assembly carrier according to claim 1, wherein each of the sectional rails (18) is designed as an assembly rail and therefor has contact surfaces (19 and 20), wherein a deep channel (21) is provided, at whose opposite walls (22 and 23) holding grooves (24) are intended for the accommodation of retaining devices and positioning elements for the plug-in circuit boards.

6. Assembly carrier according to claim 1, wherein at the back sides of both the cover plate (1) and base plate (2) a bent section of the back edge (9) is formed as a back supporting rail (7, 8).

7. Assembly carrier according to claim 1, wherein the cover plate (1) and the base plate (2) indicate curved attachment borders (13) along their long sides (12), to which the side walls (3 and 4) are fastened.

8. An assembly carrier for a plug-in circuit board, comprising:

two front supporting rails;

two side walls;

a cover plate and a base plate;

wherein each of the supporting rails includes a roof adapted for assisting insertion and removal of the plug-in circuit board, each roof including a row of holes;

wherein each roof is formed from respective front edges of the cover plate and the base plate, wherein a sectional rail of extruded aluminum is fastened on the cover plate and the base plate, defining the two front supporting rails.

* * * * *